United States Patent [19]

Abraham

[11] Patent Number: 4,535,233
[45] Date of Patent: Aug. 13, 1985

[54] BOOTSTRAP-TRANSIMPEDANCE PREAMPLIFIER FOR A FIBER OPTIC RECEIVER

[75] Inventor: Menachem Abraham, Lexington, Mass.

[73] Assignee: Digital Equipment Corporation, Maynard, Mass.

[21] Appl. No.: 342,491

[22] Filed: Jan. 22, 1982

[51] Int. Cl.³ .................... H01J 40/14; H03F 17/00; H03F 3/08
[52] U.S. Cl. .................... 250/214 A; 330/59; 330/308
[58] Field of Search .................... 250/214 A; 330/308, 330/112, 59

[56] References Cited

U.S. PATENT DOCUMENTS

| | | | |
|---|---|---|---|
| 3,218,462 | 11/1965 | Raub et al. | 250/214 A |
| 3,223,938 | 12/1965 | Brook | 330/59 |
| 3,927,383 | 12/1975 | Fjarlie et al. | 330/59 |

OTHER PUBLICATIONS

V. G. Tarasyuk and V. A. Khanov; Increasing the Operational Reliability of the Automation; Jul.-Aug. 1979; pp. 1136-1138; Institute of Automation and Electronics, Siberian Branch of the USSR Academy of Sciences, Novosibirsk, vol. 22, No. 4, Instrum. and Exper. Tech.

Primary Examiner—David C. Nelms
Assistant Examiner—James Gatto
Attorney, Agent, or Firm—Cesari and McKenna

[57] ABSTRACT

A new preamplifier for use in fiber-optic receiver applications, or other applications in which a signal detector such as a photodiode is used that exhibits a large input capacitance to the receiver circuitry. The preamplifier combines transimpedance features to generate a voltage output from a current input signal generated by photodiodes used in such applications, and bootstrap features in which the capacitance of the photodiode is bootstrapped to reduce its effect on the receiver.

9 Claims, 5 Drawing Figures

BOOTSTRAP-TRANSIMPEDANCE PREAMPLIFIER FOR A FIBER OPTIC RECEIVER

FIELD OF THE INVENTION

This invention relates primarily to the field of receivers in which the signal input constitutes a capacitive current source, most particularly diodes or transistors used to sense or detect optical or other forms of radiation. The invention is more particularly related to the field of detectors and associated preamplifiers for use in fiber-optic receivers, for use in receivers for detecting and amplifying optical signals, or for detecting optical or other forms of radiation, including some forms of nuclear radiation that is detectable using semiconductor diodes and transistors.

BACKGROUND OF THE INVENTION

In recent years, much research and development effort has been expended in the development of fiber-optic communications systems in which digital or analog signals are transmitted through glass fibers from one point to another using radiation at optical frequencies. The use of fiber-optic communications systems has been and is being explored by telephone companies to transmit telephone calls over long distances, and by other companies that are involved in local data communications for transmitting large amounts of data rapidly among parts of a data processing system or among various data processing systems in a common location.

A primary benefit from the use of optical waves as the information carrying medium is the fact that more information, for example, bits of data or telephone messages, can be carried by the higher frequency optical wave in a shorter period of time than would be possible over the portions of the electromagnetic spectrum that have heretofore been used to transfer information.

However, optical communications systems present numerous problems that are not presented by the prior information transfer arrangements. For example, the use of light waves does not permit a direct electrical connection between the transmitter and the receiver as in the prior arrangements, necessitating new receivers and detectors to change the light waves to electrical signals.

The circuit elements that are most widely used to receive optic signals are photodiodes and phototransistors, which operate in a manner very similar to the photodiode, at least as far as the emitter-base junction is concerned. In a typical application, the photodiode is reverse biased so as to normally not conduct. The photons comprising the light wave are directed to the photodiode's p-n junction, which causes a burst of current to flow through the junction.

In a transmission of digital data, the timed variation in the number of photons received can indicate the receipt of a bit of digital data. In the analog situation, the number of photons received can vary according to the amplitude of an amplitude-modulated analog signal which would be received by the photodiode as varying amounts of current therethrough.

In either the digital or analog situation, since the diode is reverse-biased, the junction of the photodiode act as a capacitor, and the capacitive effects thereof must be taken into account in designing the receiver circuit. The ease or difficulty of coupling an optic fiber to the photodiode or phototransistor is directly related to the area of the p-n junction; the larger the area of the junction, the more easily is the optic fiber coupled to the photodiode. However, with a larger junction area, the capacitance of the diode junction is also higher. The input capacitance to the first amplifying stage, including the capacitance of the photodiode junction, effects the bandwidth-gain product that is required of the subsequent amplifier stage. This product is the product of the gain of the amplifier stage, multiplied by the bandwidth of the amplifier. The gain-bandwidth product is of particular importance in situations where there are no additional stages of amplification between the output of the receiver and the input of a next stage, such as a comparator, which may be used in digital reception. Additional gain stages, or amplifiers having a higher gain-bandwidth product, can be employed; however, these stages or amplifiers would add to the cost and complexity of the receiver.

A further aspect of the photodiodes that are used as detectors in fiber-optic communications systems is that they are basically current sources, rather than voltage sources. That is, the receipt of photons results in a direct variation in flow of current through the photodiode. However, it is generally more desirable at some point in a receiver circuit to work with signal voltage variations rather than signal current variations.

It is therefore an object of the invention to provide a new and improved preamplifier for use with a detector in communications systems having a capacitive signal input source.

It is yet another object of the invention to provide a new and improved preamplifier for use with an optical signal detector in communications systems in which information is transferred using radiation at optical frequencies.

It is yet another object of the invention to provide a new and improved preamplifier for use with a detector that detects and receives radiation, including electromagnetic radiation and nuclear radiation, the detector having a substantial capacitive effect upon the input to the circuit.

It is a further object of the invention to provide a new preamplifier of the type described that converts a current signal to a voltage signal.

SUMMARY

In brief summary, the invention provides a new and improved detector and receiver that has as a signal detecting element, a device that contributes a substantial capacitance to the input capacitance of the amplifier stage. Such devices include photodiodes that are used in fiber-optic communication systems, or similar devices used in detecting such forms of radiation as nuclear radiation. Such detectors are typically diodes in which the p-n junction that is used as the detector is reverse-biased. Typically, the reverse-biased junctions of components have substantial capacitances that effect the characteristics of the receiver. Other similar detecting elements which are not semiconductor devices include scintillation devices in which the radiation is received between parallel plates, the radiation causing a discharge between the plates. These components also have a substantial capacitance caused by the parallel plates.

To maximize speed and sensitivity, the invention provides a novel preamplifier circuit that includes both bootstrap and transimpedance features. The detector, for example, a photodiode, is coupled to an input buffer amplifier between the buffer amplifier's input and output connections. This bootstrapping of the photodiode minimizes the capacitive effects of the detector on the circuit, thereby maximizing the gain-bandwidth product of the entire preamplifier. A subsequent amplifying stage receives the output signal of the buffer, and a second buffer buffers the output of the amplifying stage. A feedback impedance, which may be constituted by a lone resistor or by a resistive network, is connected between the output of the second buffer and the input of the first buffer to provide a flat response typical of transimpedance-type amplifiers. The transimpedance feature also serves to convert the current signal generated by the photodiode into a voltage signal for subsequent receiver circuits.

The novel bootstrap-transimpedance receiver has a superior performance compared to prior art receivers which uses open loop amplification, with or without bootstrapping. This circuit is also superior to conventional preamplifier circuit techniques using the transimpedance technique of the resistive feedback from the output of the circuit to the input.

BRIEF DESCRIPTION OF THE DRAWINGS

For a fuller understanding of the nature and objects of the invention, reference should be made to the following detailed description taken in conjunction with the accompanying drawings in which.

DESCRIPTION OF AN ILLUSTRATIVE EMBODIMENT

Figure 1:
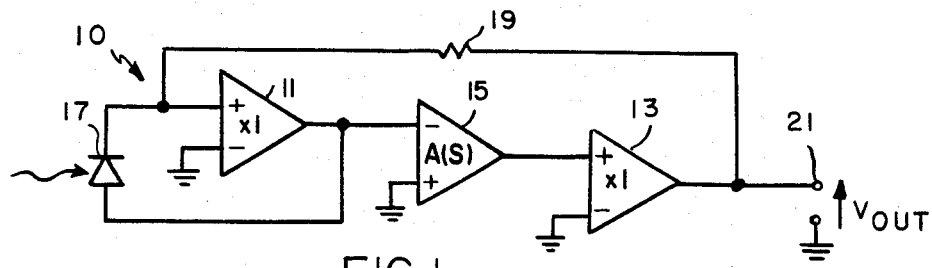
FIG. 1 is a schematic circuit diagram for a novel bootstrap-transimpedance detector and receiver circuit according to the invention.

With reference first to FIG. 1, the inventive bootstrap-transimpedance detector and preamplifier circuit comprises a three-stage amplifier, including an input buffer circuit 11 and an output buffer circuit 13, each of which has a unitary voltage gain. A voltage amplifier 15 receives input signals from buffer circuit 11 and transmits the amplified signal to buffer circuit 13. All of amplifiers 11, 13 and 15 have non-inverting inputs designated by a (+) and inverting inputs designated by (−).

A detector, such as photodiode 17, is connected between the non-inverting input of buffer circuit 11 and the output of buffer circuit 11. This configuration provides a bootstrap connection in which the alternating current voltage drop through the capacitance of detector 17 is zero, thereby eliminating any capacitive effects inherent in the photodetector from effecting the circuit performance.

A feedback resistor 19 from the output of buffer amplifier 13 to the junction between the detector 17 and the non-inverting input of the buffer amplifier 11 completes the bootstrap-transimpedance detector and preamplifier circuit 10. The output of the detector and receiver circuit is taken from the output of buffer amplifier 13 and then connected to the rest of the receiver circuit, which in a digital application may constitute a voltage comparator.

Figure 3:
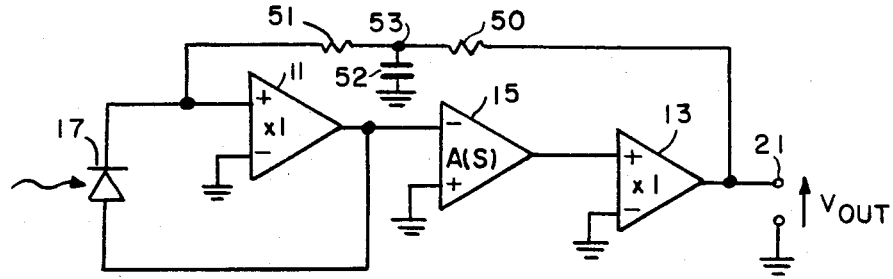
FIG. 3 is a schematic circuit diagram of a second embodiment of the circuit depicted in FIG. 1.

As an alternative, a resistive impedance network can be used in place of resistor 19. Such a network can include a pi- or T- network in which one or more resistors are bypassed to ground by capacitors, thus forming a low-pass filter that only feeds back signals below a selected cut-off frequency. FIG. 3 illustrates the use of a T-network in place of resistor 19. The T-network includes resistors 50 and 51 connected between the output of amplifier 13 and the non-inventory input of amplifier 11, and a capacitor 52 connected between ground and the node 53 between the two resistors.

Figure 2A:
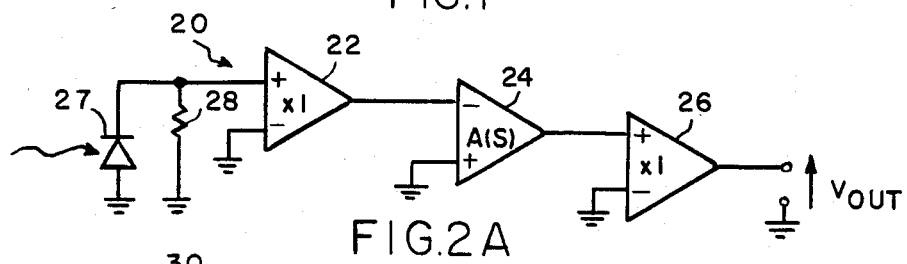
FIG. 2, comprising FIGS. 2A, 2B and 2C, exemplifies several prior art circuit designs for a detector and receiver circuit for a fiber-optic receiver
Figure 2B:
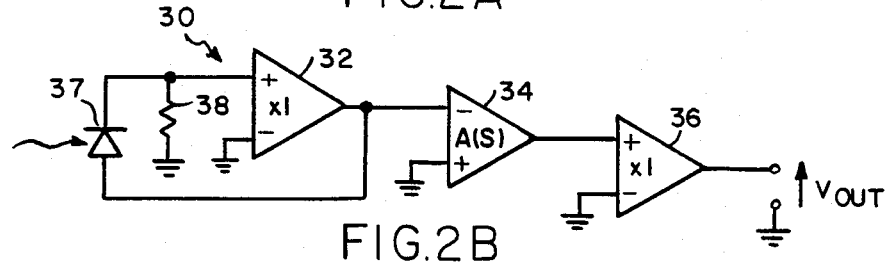
Figure 2C:
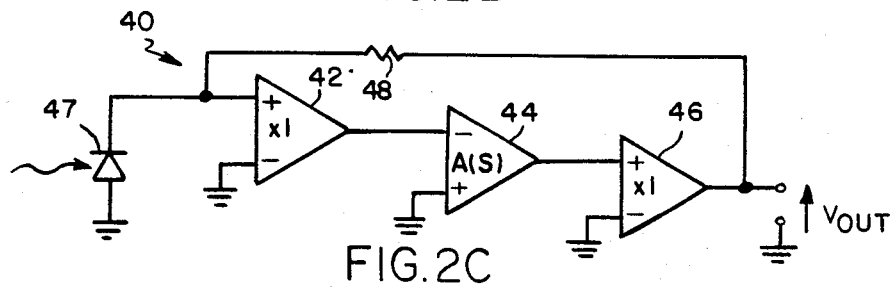

FIGS. 2A, 2B, and 2C contain circuit diagrams of prior art detector and preamplifier circuit configurations which can be compared to the novel configuration set forth in FIG. 1. All of these circuits include a buffer amplifier 22, 32, and 42, which feeds a voltage amplifier 24, 34 and 44, which in turn feeds a subsequent buffer amplifier 26, 36 and 46. A photo detector, such as photodiodes 27, 37 and 47, is connected to the non-inverting input of the first buffer amplifier 22, 32, and 42. The inverting inputs to all of the buffer amplifiers are grounded. In FIGS. 2A and 2B, a resistor is connected between the detector-buffer amplifier junction and ground, whereas in FIG. 2C the resistor is connected between the junction between detector 47 and amplifier 42 and the output of amplifier 46, as a feedback resistor. The circuit in FIG. 2C is a transimpedance amplifier.

One end of detector 37 in FIG. 2B is connected to the output of amplifier 32, in a bootstrap configuration. One end of each of the detectors 27 and 47 in FIGS. 2A and 2C is grounded.

As can be seen from FIGS. 2A and 2B, the conventional preamplifier circuit and the bootstrap preamplifier circuit both require an input resistor 28 and 38, respectively, to convert the current signal generated by the photodiode, into a voltage signal that is coupled to the respective buffer amplifier. However, the input resistor, combined with the capacitance of the photodiode, has a time constant that can effect the speed of response of the preamplifier. The sensitivity of these circuits to incident radiation is related to the value of these input resistances, the larger the input resistances resulting in more sensitive preamplifiers. However, the higher the resistance, the lower the speed of response that can be attained with the circuit.

Furthermore, the open loop approach used in the configurations of FIGS. 2A and 2B places great demands on the gain-bandwidth product of the amplifiers used in the respective circuits 20 and 30, thereby increasing their cost. The transimpedance circuit, shown in FIG. 2C eliminates the need for the input resistor. This transimpedance circuit uses a feedback resistor that is larger than the input resistor that would be used in the approaches of FIGS. 2A and 2B, thereby reducing the noise and increasing the sensitivity of the preamplifier. However, it increases the effect of the capacitance of detector 47 on the circuit response. The effect of the detector capacitance is reduced if not eliminated in the bootstrap circuit configuration of FIG. 2B.

It can be seen, therefore, that the circuit configuration of the novel circuit of FIG. 2 attains the advantages of both the transimpedance and the bootstrap arrangements shown in FIGS. 2B and 2C, respectively, with the detriments of neither. The circuit arrangement of FIG. 1 eliminates the need for an input resistor to generate a voltage signal from the current generated by detector 17 for and the buffer amplifier 11, thereby increasing the sensitivity of the detector-preamplifier circuit 10 and minimizing the gain-bandwidth requirements of the amplifiers used in the circuit. Furthermore, the bootstrapping of the capacitance of detector 17 eliminates the effect of the detector capacitance on the circuit response. This reduces the total input capacitance of the preamplifier circuit thereby reducing the gain-bandwidth product required of the amplifiers for a given preamplifier bandwidth. The novel bootstrap-transimpedance preamplifier thus results in a simple and low cost circuitry, which can reduce the cost of such circuit and improve circuit response.

The novel bootstrap-transimpedance preamplifier of FIG. 1 thus results in a number of improvements in operation, cost and design features, which may be briefly summarized as follows. First, for a specified measure of sensitivity, bandwidth and transimpedance of the preamplifier, a voltage amplifier 15, 24, 34 or 44 may be used having a lower gain-bandwidth product, thereby simplifying the circuit and allowing the use of lower-cost components and circuitry than would be permitted by the approaches of FIGS. 2A–2C.

Second, with a given circuit for voltage amplifier 15, 24, 34 or 44, and a specified preamplifier bandwidth, preamplifier 10 would have more sensitivity than would be permitted by the approaches of FIGS. 2A–2C.

Third, with a given circuit for voltage amplifier 15, 24, 34 or 44 and a specified preamplifier bandwidth, the preamplifier 10 would have higher output signal levels than would the approaches of FIGS. 2A–2C, for the same optical input.

Finally, with a given circuit for voltage amplifier 15, 24, 34 or 44, the preamplifier of FIG. 1 would have a faster speed of response than would the preamplifier approaches of FIGS. 2A–2C.

It can thus be seen from the foregoing that the invention provides a new and improved detector and receiver for use with detectors that have a capacitive input. The foregoing description is limited to a specific embodiment of this invention. It will be apparent, however, that this invention can be practiced in data processing systems having diverse basic construction or in systems that use different internal circuitry than is described in this specification with the attainment of some or all of the foregoing objects and advantages of this invention. Therefore, it is the object of the appended claims to cover all such variations and modifications as come within the true spirit and scope of this invention.

What is claimed as new and desired to be secured by Letters Patent of the United States is:

1. A bootstrap-transimpedance preamplifier for receiving signals from a capacitive current source comprising:
   bootstrap buffer means having an input connected to the capacitive current source for receiving signals therefrom, and for generating an output signal in response to signals from the capacitive current source;
   voltage amplifer means having an input connected receive the output signal from the bootstrap buffer means and for generating an output signal in response thereto;
   second buffer means connected to the output of said voltage amplifier means for generating an output signal in response to the output signal from said voltage amplifier means; and
   feedback means connected to the output of said second buffer means and the input of said bootstrap buffer means for coupling a signal proportional to the output signal from said second buffer means to the input of said bootstrap buffer means.

2. A preamplifier as defined in claim 1 in which said bootstrap buffer means comprises a buffer amplifier having an input and an output, the capacitive current source being connected between the input and the output of said buffer amplifier.

3. A preamplifier as defined in claim 2 in which the capacitive current source is a photodetecting diode having one end connected to the output of said buffer amplifier and another end connected to the input of said buffer amplifier.

4. A preamplifier as defined in claim 1 in which said feedback means comprises resistor means connected between the output of said voltage amplifier means and the input of said bootstrap buffer means.

5. A bootstrap-transimpedance preamplifier for receiving signals from a capacitive current source comprising:
   bootstrap buffer means having an input connected to the capacitive current source for receiving signals therefrom, and for generating an output signal in response to signals from the capacitive current source;
   voltage amplifer means having an input connected to receive the output signal from the bootstrap buffer means and for generating an output signal in response thereto;
   feedback means comprising a resistive network connected to the output of said voltage amplifier means and the input of said bootstrap buffer means for coupling a signal proportional to the output signal from said voltage amplifier buffer means to the input of said bootstrap buffer means.

6. A preamplifier as defined in claim 5 in which said bootstrap buffer means comprises a buffer amplifier having an input and an output, the capacitive current source being connected between the input and the output of said buffer amplifier.

7. A preamplifier as defined in claim 6 in which the capacitive current source is a photodetecting diode having one end connected to the output of said buffer amplifier and another end connected to the input of said buffer amplifier.

8. A preamplifier as defined in claim 4 in which said feedback means comprises resistor means connected between the output of said voltage amplifier means and the input of said bootstrap buffer means.

9. A preamplifier as defined in claim 4 in which said resistive network comprises a T-network in which two resistors are connected in series between the ouput of said voltage amplifier means and the input of said bootstrap means, and a capacitor is connected between the junction between said resistors and ground.

* * * * *